(12) United States Patent
Lee et al.

(10) Patent No.: US 11,264,540 B2
(45) Date of Patent: Mar. 1, 2022

(54) LIGHT EMITTING DIODE WITH HIGH LUMINOUS EFFICIENCY

(71) Applicant: Seoul Viosys Co., Ltd., Ansan-si (KR)

(72) Inventors: Joon Hee Lee, Ansan-si (KR); Mi Hee Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 890 days.

(21) Appl. No.: 15/145,528

(22) Filed: May 3, 2016

(65) Prior Publication Data

US 2016/0247971 A1     Aug. 25, 2016

Related U.S. Application Data

(63) Continuation of application No. PCT/KR2015/010137, filed on Sep. 24, 2015.

(30) Foreign Application Priority Data

Sep. 26, 2014 (KR) .................. 10-2014-0129009
Apr. 17, 2015 (KR) .................. 10-2015-0054554

(51) Int. Cl.
*H01L 33/38* (2010.01)
*H01L 33/40* (2010.01)

(52) U.S. Cl.
CPC .......... *H01L 33/382* (2013.01); *H01L 33/405* (2013.01); *H01L 2933/0016* (2013.01)

(58) Field of Classification Search
CPC .............. H01L 33/382; H01L 33/405; H01L 2933/0016
See application file for complete search history.

(56) References Cited

U.S. PATENT DOCUMENTS

| 4,223,336 A * | 9/1980 | Thompson ............ H01L 29/207 257/607 |
| 8,212,276 B2 * | 7/2012 | Gong ...................... H01L 33/38 257/103 |

(Continued)

FOREIGN PATENT DOCUMENTS

| CN | 103346218 | 10/2013 |
| JP | 2013-201411 | 10/2013 |

(Continued)

OTHER PUBLICATIONS

International Search Report dated Jan. 13, 2016 in International Application No. PCT/KR2015/010137.

(Continued)

*Primary Examiner* — Allen L Parker
*Assistant Examiner* — Charles N Ausar-El
(74) *Attorney, Agent, or Firm* — H.C. Park & Associates, PLC

(57) ABSTRACT

A light emitting diode includes a light emitting structure including first and second conductive type semiconductor layers and an active layer disposed therebetween, a second hole formed through the active layer and the second conductive type semiconductor layer, and exposing the first conductive type semiconductor layer, a reflective metal layer contacting a portion of the light emitting structure, a cover metal layer contacting at least a portion of the reflective metal layer, a first insulation layer covering the reflective metal layer and the cover metal layer, an electrode layer disposed on the first insulation layer, the electrode layer covering the first insulation layer and filling the second hole, an electrode pad disposed on the light emitting structure, and a first hole formed through the first conductive type semiconductor layer and corresponding to the cover metal layer, in which the electrode pad overlaps the cover metal layer.

14 Claims, 13 Drawing Sheets

(56) References Cited

U.S. PATENT DOCUMENTS

| | | | | |
|---|---|---|---|---|
| 9,099,629 B2* | 8/2015 | Yang | | H01L 33/382 |
| 9,142,725 B1* | 9/2015 | Suzuki | | H01L 33/385 |
| 9,236,544 B2* | 1/2016 | Jeong | | H01L 33/60 |
| 9,281,446 B2* | 3/2016 | Suh | | H01L 33/382 |
| 9,412,907 B1* | 8/2016 | Place | | H01L 33/382 |
| 9,461,210 B2* | 10/2016 | Takenaga | | H01L 33/382 |
| 9,577,165 B2* | 2/2017 | Perzlmaier | | H01L 33/382 |
| 9,705,041 B2* | 7/2017 | Im | | H01L 33/382 |
| 9,865,778 B2* | 1/2018 | Yum | | H01L 33/405 |
| 10,026,778 B2* | 7/2018 | Jou | | H01L 27/156 |
| 10,355,170 B2* | 7/2019 | Weiss | | H01L 33/38 |
| 2007/0236640 A1* | 10/2007 | Kimura | | H01L 29/78696 |
| | | | | 349/141 |
| 2008/0079001 A1* | 4/2008 | Umezaki | | H01L 27/1214 |
| | | | | 257/59 |
| 2008/0096297 A1* | 4/2008 | Schiaffino | | H01L 33/382 |
| | | | | 438/22 |
| 2009/0061625 A1* | 3/2009 | Kim | | G02F 1/13452 |
| | | | | 438/669 |
| 2009/0072297 A1* | 3/2009 | Lee | | B82Y 10/00 |
| | | | | 257/324 |
| 2009/0140398 A1* | 6/2009 | Jung | | H01L 21/0337 |
| | | | | 257/638 |
| 2010/0078656 A1* | 4/2010 | Seo | | H01L 27/156 |
| | | | | 257/88 |
| 2010/0133505 A1* | 6/2010 | Takao | | H01L 33/0079 |
| | | | | 257/13 |
| 2011/0163346 A1* | 7/2011 | Seo | | H01L 33/42 |
| | | | | 257/99 |
| 2011/0210362 A1* | 9/2011 | Lee | | H01L 33/382 |
| | | | | 257/98 |
| 2012/0007044 A1* | 1/2012 | Seo | | H01L 25/0753 |
| | | | | 257/13 |
| 2012/0032139 A1 | 2/2012 | Kimura et al. | | |
| 2012/0049219 A1* | 3/2012 | Kamiya | | H01L 33/382 |
| | | | | 257/98 |
| 2012/0062814 A1* | 3/2012 | Yamazaki | | G02F 1/1333 |
| | | | | 349/43 |
| 2012/0119243 A1 | 5/2012 | Kim et al. | | |
| 2013/0228744 A1 | 9/2013 | Kazama | | |
| 2014/0048840 A1* | 2/2014 | Kim | | H01L 33/62 |
| | | | | 257/99 |
| 2014/0166976 A1* | 6/2014 | Im | | H01L 33/40 |
| | | | | 257/13 |
| 2014/0231853 A1* | 8/2014 | Uemura | | H01L 33/10 |
| | | | | 257/98 |
| 2014/0319566 A1* | 10/2014 | Perzlmaier | | H01L 33/382 |
| | | | | 257/98 |
| 2014/0339566 A1* | 11/2014 | Seo | | H01L 33/42 |
| | | | | 257/76 |
| 2016/0005926 A1* | 1/2016 | Chen | | H01L 33/387 |
| | | | | 257/98 |
| 2017/0200854 A1* | 7/2017 | An | | H01L 33/0079 |
| 2017/0288094 A1* | 10/2017 | Weiss | | H01L 33/38 |
| 2017/0317067 A1* | 11/2017 | Moosburger | | H01L 27/15 |
| 2017/0317240 A1* | 11/2017 | Maute | | H01L 33/46 |
| 2017/0324000 A1* | 11/2017 | Engl | | H01L 33/405 |
| 2017/0352700 A1* | 12/2017 | Malm | | H01L 27/156 |

FOREIGN PATENT DOCUMENTS

| | | | | |
|---|---|---|---|---|
| JP | 2014-158001 | | 8/2014 | |
| KR | 10-2012-0070988 | | 7/2012 | |
| KR | 10-2013-0009719 | | 1/2013 | |
| KR | 1020120026879 | * | 9/2013 | H01L 33/22 |
| KR | 10-2014-0057811 | | 5/2014 | |
| WO | WO2013137571 A1 | * | 9/2013 | |

OTHER PUBLICATIONS

Second Office Action dated May 15, 2019, issued in Chinese Patent Application No. 201580044488.0.

Chinese Office Action dated Dec. 7, 2021, in Chinese Patent Office for Chinese Patent Application No. 201910695443.

* cited by examiner

LIGHT EMITTING DIODE WITH HIGH LUMINOUS EFFICIENCY

CROSS-REFERENCE TO RELATED APPLICATIONS

This application is a continuation of International Application PCT/KR2015/010137, filed on Sep. 24, 2015, and claims priority from and the benefit of Korean Patent Application No. 10-2014-0129009, filed on Sep. 26, 2014, and Korean Patent Application No. 10-2015-0054554, filed on Apr. 17, 2015, which are incorporated by reference for all purposes as if fully set forth herein.

BACKGROUND

Field

Exemplary embodiments relate to a light emitting diode, and more particularly, to a light emitting diode including an embedded electrode layer.

Discussion of the Background

A light emitting diode is an inorganic semiconductor device that generates light through recombination of electrons and holes. Such a light emitting diode may be used in various fields including displays, vehicle lamps, general lighting, and the like, and an application range of the light emitting diode has expanded.

As for the light emitting diode, a lateral type light emitting diode, in which an n-type electrode and a p-type electrode are laterally disposed, is broadly used. Although the lateral type light emitting diode may be relatively easily fabricated, luminous area thereof may be reduced due to partial removal of an active layer to form electrodes on a lower semiconductor layer. Further, lateral arrangement of the electrodes may cause current crowding, thereby deteriorating luminous efficacy of the light emitting diode. Moreover, a sapphire substrate may be generally used as a growth substrate for lateral type light emitting diodes, which may cause inefficient heat discharge due to low thermal conductivity thereof. As such, the lateral type light emitting diode may increase junction temperature of the light emitting diode and deteriorate an internal quantum efficiency thereof.

A vertical type light emitting diode and a flip-chip type light emitting diode have been developed, to improve the problems of the lateral type light emitting diode. A typical light emitting diode may include a conductive substrate, a first electrode layer, an insulation layer, a second electrode layer, a second semiconductor layer, an active layer, and a first semiconductor layer, which are sequentially stacked. In this structure, in order to electrically connect the second semiconductor layer, an electrode pad is formed on an exposed region laterally extending from the second electrode layer.

However, the electrode pad may be damaged by oxidation and the like during manufacturing of the light emitting diode having such structure, which may increase contact resistance and forward voltage. Accordingly, the light emitting diode may have reduction in output, which may deteriorate reliability and lifespan of the light emitting diode.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a light emitting diode that may prevent reduction of output and improve yield.

Additional aspects will be set forth in part in the detailed description which follows and, in part, will be apparent from the disclosure, or may be learned by practice of the inventive concept.

According to an exemplary embodiment of the present invention, a light emitting diode includes a light emitting structure including a second conductive type semiconductor layer, a first conductive type semiconductor layer disposed on the second conductive type semiconductor layer, and an active layer disposed between the first and second conductive type semiconductor layers, a second hole formed through the active layer and the second conductive type semiconductor layer, and exposing the first conductive type semiconductor layer, a reflective metal layer disposed on the light emitting structure and contacting a portion of the light emitting structure, a cover metal layer disposed on the reflective metal layer and contacting at least a portion of the reflective metal layer, a first insulation layer disposed on the cover metal layer and covering the reflective metal layer and the cover metal layer, an electrode layer disposed on the first insulation layer, the electrode layer covering the first insulation layer and filling the second hole, an electrode pad disposed on the light emitting structure, and a first hole formed through the first conductive type semiconductor layer and corresponding to the cover metal layer, in which the electrode pad overlaps the cover metal layer.

According to an exemplary embodiment of the present invention, a light emitting diode includes a light emitting structure including a second conductive type semiconductor layer, a first conductive type semiconductor layer disposed on the second conductive type semiconductor layer, and an active layer disposed between the first and second conductive type semiconductor layers, a first hole and a second hole formed through the active layer and the second conductive type semiconductor layer to expose the first conductive type semiconductor layer, a metal layer disposed on the light emitting structure and covering a portion of the light emitting structure, a first insulation layer disposed on the metal layer and covering the metal layer, an electrode layer disposed on the first insulation layer, the electrode layer covering the first insulation layer and filling the first and second holes, and an electrode pad electrically connected to the metal layer, in which the electrode layer filling the second hole is a line electrode, the line electrode being disposed along a periphery of the light emitting structure in one direction.

According to exemplary embodiments, a light emitting structure of the light emitting diode has an enlarged luminous area through removal of a cover metal layer, thereby improving luminous efficacy of the light emitting diode. Further, as a contact area between the reflective metal layer and the cover metal layer is reduced, metal stress caused by contact is reduced, thereby improving yield of the light emitting diode. In addition, the light emitting diode has a line electrode formed along a periphery thereof and thus prevents luminous efficacy from being deteriorated at the periphery of the light emitting diode due to current crowding at a central region thereof, thereby enabling uniform light emission throughout the light emitting diode.

The foregoing general description and the following detailed description are exemplary and explanatory and are intended to provide further explanation of the claimed subject matter.

DETAILED DESCRIPTION OF THE ILLUSTRATED EMBODIMENTS

Figure 1:
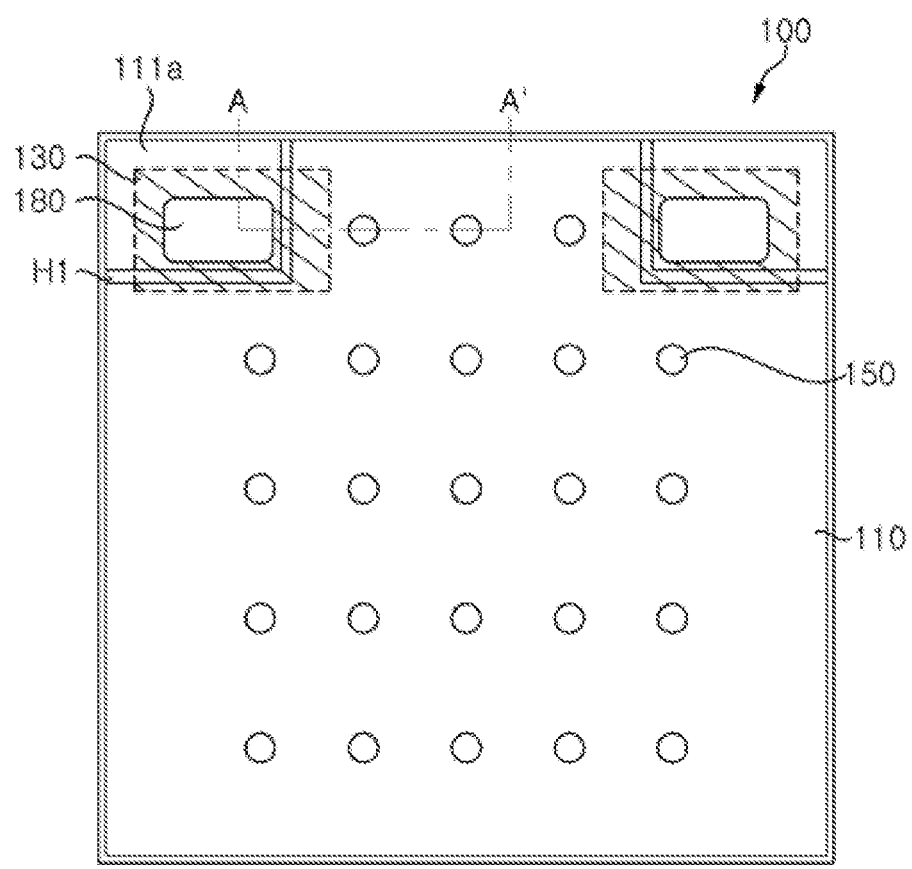
FIG. 1 is a plan view of a light emitting diode, according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
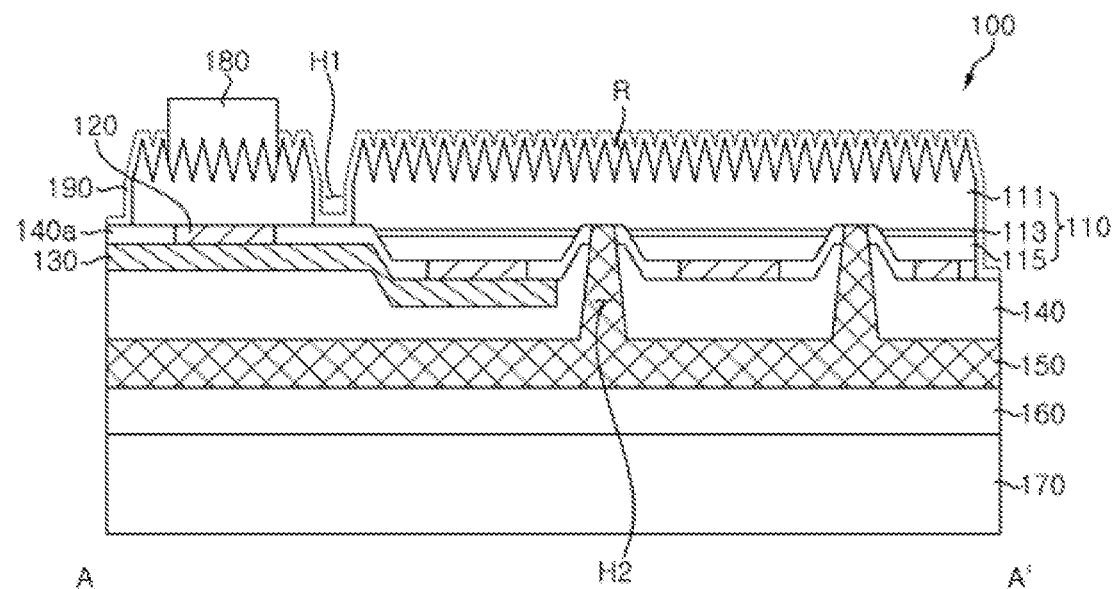
FIG. 2 is a cross-sectional view taken along line A-A' of FIG. 1.

FIG. 1 is a plan view of a light emitting diode, according to an exemplary embodiment of the present invention. FIG. 2 is a sectional view taken along line A-A' of FIG. 1.

Referring to FIGS. 1 and 2, a light emitting diode 100 according to the present exemplary embodiment includes a light emitting structure 110, metal layers 120 and 130, a first insulation layer 140, an electrode layer 150, a bonding layer 160, a substrate 170, electrode pads 180, and a protective layer 190.

The light emitting structure 110 includes a first conductive type semiconductor layer 111, an active layer 113, and a second conductive type semiconductor layer 115. The first conductive type semiconductor layer 111 may be disposed on the second conductive type semiconductor layer 115, and the active layer 113 may be interposed between the first conductive type semiconductor layer 111 and the second conductive type semiconductor layer 115. In the present exemplary embodiment, the first conductive type semiconductor layer 111 may further include a roughness "R" formed on an upper surface thereof and lower mesas formed under the roughness "R".

Each of the first conductive type semiconductor layer 111 and the second conductive type semiconductor layer 115 may include a III-V-based compound semiconductor, for example, a nitride-based semiconductor, such as (Al, Ga, In)N. The first conductive type semiconductor layer 111 may include an n-type semiconductor layer doped with n-type dopants such as Si, and the second conductive type semiconductor layer 115 may include a p-type semiconductor layer doped with p-type dopants, such as Mg. The dopants used in the first conductive type semiconductor layer 111 and the second conductive type semiconductor layer 115 may be interchanged.

Each of the first conductive type semiconductor layer 111 and the second conductive type semiconductor layer 115 may have a single layer or multiple layer structure. For example, the first conductive type semiconductor layer 111 and/or the second conductive type semiconductor layer 115 may include a clad layer and a contact layer, and may also include a superlattice layer.

The active layer 113 may include a multi-quantum well (MQW) structure, and elements constituting the multi-quantum well structure and the composition thereof may be adjusted, such that the multi-quantum well structure may emit light with a desired peak wavelength. For example, a well layer (not shown) of the active layer 113 may be a ternary semiconductor layer, such as indium gallium nitride (InGaN), or a quaternary semiconductor layer, such as aluminum indium gallium nitride (AlInGaN), where a composition ratio of components may be adjusted according to a desired peak wavelength.

First holes H1 may be formed through the light emitting structure 110 by partially removing the light emitting structure 110. In the present exemplary embodiment, two first holes H1 are formed, such that two pad installation sections 111a disposed at corners of the light emitting diode 100 are divided from the light emitting structure 110, by the two holes H1. Although each pad installation section 111a illustrated in FIG. 1 has a rectangular shape by the first hole H1, the shape of the pad installation sections 111a may be varied.

The pad installation sections 111a are disposed at the corners of the light emitting diode 100, respectively, and may be flush with the light emitting structure 110, as shown in FIG. 1. The pad installation sections 111a are formed in the course of forming the light emitting structure 110, and thus, may include a semiconductor layer having the same composition as that of the first conductive type semiconductor layer 111 of the light emitting structure 110. Since the pad installation sections 111a may be flush with the light emitting structure 110, the electrode pads 180 disposed on the pad installation sections 111a may protrude above the light emitting structure 110, which may reduce defect rate upon wire bonding.

The roughness "R" may be formed on the upper surface of the first conductive type semiconductor layer 111, and may include irregular bumps and depressions. The light emitting structure 110 including the roughness "R" on the upper surface thereof may improve light extraction efficiency, upon emission of light through the upper surface of the light emitting structure 110.

The roughness "R" may be formed by wet etching with a solution including at least one of potassium hydroxide (KOH) and sodium hydroxide (NaOH), or by photoelectrochemical (PEC) etching. Alternatively, the roughness "R" may be naturally formed in the course of separating a growth substrate from the first conductive type semiconductor layer 111. For example, the roughness "R" may be formed on a separated surface of the first conductive type semiconductor layer 111, and may originate from cavities formed by a sacrificial layer, which is additionally formed for separation of the growth substrate, when the growth substrate is separated from the first conductive type semiconductor layer 111 by chemical lift-off or stress lift-off. As such, the roughness "R" may be formed by various methods.

Mesas may be formed on a lower side of the light emitting structure 110. The mesas may include the second conductive type semiconductor layer 115 and the active layer 113, and may further include a portion of the first conductive type semiconductor layer 111. In the present exemplary embodiment, the mesas may have a partially protruded shape, as shown in FIGS. 1 and 2. The mesas may alternatively have various shapes and sizes.

One or more second holes H2 may be formed in the mesa. The electrode layer 150 fills the second holes H2, such that the electrode layer 150 may be electrically connected to the first conductive type semiconductor layer 111. Although multiple second holes H2 are illustrated as being regularly arranged at certain intervals in FIG. 1, locations and arrangement of the second holes H2 may alternatively be varied.

The metal layers 120 and 130 are formed under the light emitting structure 110, and include a reflective metal layer 120 and a cover metal layer 130. The metal layers 120 and 130 may be electrically connected to the second conductive type semiconductor layer 115. In the present exemplary embodiment, the metal layers 120 and 130 directly contact the second conductive type semiconductor layer 115, as shown in FIG. 2.

The reflective metal layer 120 may reflect light emitted from the light emitting structure 110, and may function as an electrode electrically connected to the second conductive type semiconductor layer 115, according to the present exemplary embodiment. Accordingly, the reflective metal layer 120 may include a metal having high reflectivity, which may form ohmic contact with the second conductive type semiconductor layer 115. Accordingly, the reflective metal layer 120 may include at least one of Ni, Pt, Pd, Rh, W, Ti, Al, Ag, and Au, and may have a single layer or multiple layers structure.

When the reflective metal layer 120 has a single layer, the reflective metal layer 120 may be formed only in some regions of the light emitting diode 100, rather than on the entire region, as shown in FIG. 2. More particularly, in a region of the mesa including an inclined surface, a second insulation layer 140a (for example, $SiO_2$) is formed without forming the reflective metal layer 120, such that the reflective metal layer 120 may be formed only in a flat region. In this manner, the reflective metal layer 120 is formed to have a smaller area than the second conductive type semiconductor layer 115, and the electrode layer 150 filling the second holes H2 may not directly contact the reflective metal layer 120. The second insulation layer 140a may include, for example, $SiO_2$ or SiN.

The reflective metal layer 120 is disposed on a substantial region of the second conductive type semiconductor layer 115, excluding a region in which the second hole H2 is formed, such that most light emitted from the active layer 113 directed in the downward direction may reach the reflective metal layer 120, and reflected in the upward direction by the reflective metal layer 120. As such, light extraction efficiency of the light emitting diode 100 may be improved.

The cover metal layer 130 is formed to cover some region of the reflective metal layer 120. As shown in FIG. 2, the cover metal layer 130 covers some region of the reflective metal layer 120 including a region where the electrode pads 180 are formed. In general, the cover metal layer 130 may be formed to cover the entire reflective metal layer 120, which may cause metal stress between the reflective metal layer 120 and the cover metal layer 130 over the reflective metal layer 120. According to the present exemplary embodiment, the cover metal layer 130 is formed to cover some region of reflective metal layer 120, to reduce metal stress between the cover metal layer 130 and the reflective metal layer 120, which may reduce peeling caused thereby and improve reflection efficiency thereof.

The cover metal layer 130 may be electrically connected to the reflective metal layer 120 and electrically connected to the second conductive type semiconductor layer 115. In this manner, the cover metal layer 130 may function as an electrode together with the reflective metal layer 120. The cover metal layer 130 may include at least one of Au, Ni, Ti, Cr, Pt, W, and TiW, and may have a single layer or multiple layers structure.

The first insulation layer 140 is disposed under the light emitting structure 110. In particular, the first insulation layer 140 is formed to surround the second holes H2 formed in the lower mesas. The first insulation layer 140 may include an insulation material. Further, the first insulation layer 140 may include multiple layers and a distributed Bragg reflector, in which materials having different indices of refraction are stacked over each other. When the first insulation layer 140 includes the distributed Bragg reflector, the thickness thereof may increase, which may reduce a step therefrom.

The electrode layer 150 is disposed under the first insulation layer 140. A first electrode 150a may extend from a portion of the electrode layer 150, and form ohmic contact with the first conductive type semiconductor layer 111 through the second holes H2. Accordingly, electric current supplied through the electrode layer 150 may be supplied to the first conductive type semiconductor layer 111 through the first electrode 150a.

Multiple first electrodes 150a may extend from the electrode layer 150. The first electrodes 150a may be arranged in a pattern over the electrode layer 150, as shown in FIG. 1. Arrangement of the first electrodes 150a, however, may alternatively be varied. When the first electrodes 150a are arranged throughout the light emitting diode 100, current spreading efficiency of the light emitting diode 100 may be improved.

The bonding layer 160 is disposed under the electrode layer 150, and bonds the substrate 170 to the electrode layer 150. In particular, the substrate 170 is bonded to the light emitting structure 110 through the bonding layer 160. The bonding layer 160 may be electrically connected to the first electrodes 150a on the electrode layer 150, and may electrically connect the substrate 170 to the electrode layer 150. To this end, the bonding layer 160 may include Au and Sn, and may also include NiSn or AuIn.

The substrate 170 is disposed under the bonding layer 160, and may allow electric current to be supplied to the electrode layer 150 and the first conductive type semiconductor layer 111 therethrough, when the electric current is supplied to the substrate 170.

The substrate 170 may function as a support substrate, and may be a conductive substrate, a circuit board, or a patterned insulation substrate. According to an exemplary embodiment of the present invention, the substrate 170 may include a metal and may have a stacked structure including a molybdenum (Mo) layer and a copper (Cu) layer. The substrate 170 may include Ti, Cr, Ni, Al, Cu, Ag, Au, Pt, and the like.

The light emitting diode 100 according to the present exemplary embodiment includes electrode pads 180, each disposed on the pad installation section 111a. Each of the electrode pads 180 may be disposed on the pad installation section 111a having roughness "R" formed thereon, and electrically connected to the first conductive type semiconductor layer 111.

The electrode pad 180 may include electrode pad layers including an upper electrode pad layer (not shown) and a lower electrode pad layer (not shown). The lower electrode pad layer is formed on the first conductive type semiconductor layer 111 having the roughness "R" formed thereon, and the upper electrode pad layer may be formed on the lower electrode pad layer.

The light emitting diode 100 according to the present exemplary embodiment may further include a protective layer 190 as shown in FIG. 2. The protective layer 190 may cover the upper surface of the first conductive type semiconductor layer 111 and a side surface of the first conductive type semiconductor layer 111, to protect the light emitting structure 110 from an external environment. The protective layer 190 may further cover the roughness "R" on the upper surface of the first conductive type semiconductor layer 111, to form a smooth inclination than that in the roughness "R", which may improve light extraction efficiency. The protective layer 190 may include an insulation material, for example, $SiO_2$.

FIGS. 3A, 3B, 3C, 3D, 3E, 3F, 3G, 3H, 3I, and 3J show sectional views illustrating a method for fabricating the light emitting diode, according to an exemplary embodiment of the present invention.

Figure 3A:
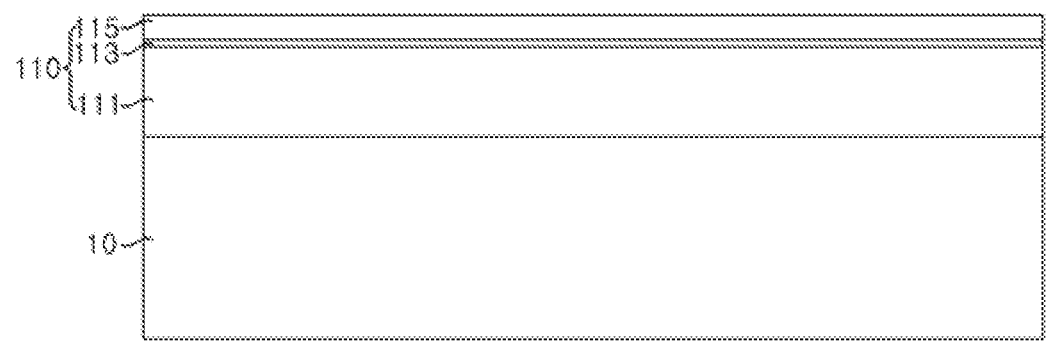
FIGS. 3A, 3B, 3C, 3D, 3E, 3F, 3G, 3H, 3I, and 3J are sectional views illustrating a method for fabricating the light emitting diode, according to an exemplary embodiment of the present invention.

Referring to FIG. 3A, a light emitting structure 110 including a first conductive type semiconductor layer 111, an active layer 113, and a second conductive type semiconductor layer 115, is formed.

The light emitting structure 110 is grown on a growth substrate 10. As for the growth substrate 10, any substrate that may allow growth of the light emitting structure 110 thereon may be used. For example, the growth substrate 10 may be a sapphire substrate, a silicon carbide substrate, a silicon substrate, a gallium nitride substrate, an aluminum nitride substrate, and the like.

The first conductive type semiconductor layer 111, the active layer 113, and the second conductive type semiconductor layer 115 may be grown on the growth substrate 10 by, for example, metal organic chemical vapor deposition (MOCVD), molecular beam epitaxy (MBE), or hydride vapor phase epitaxy (HVPE).

Figure 3B:
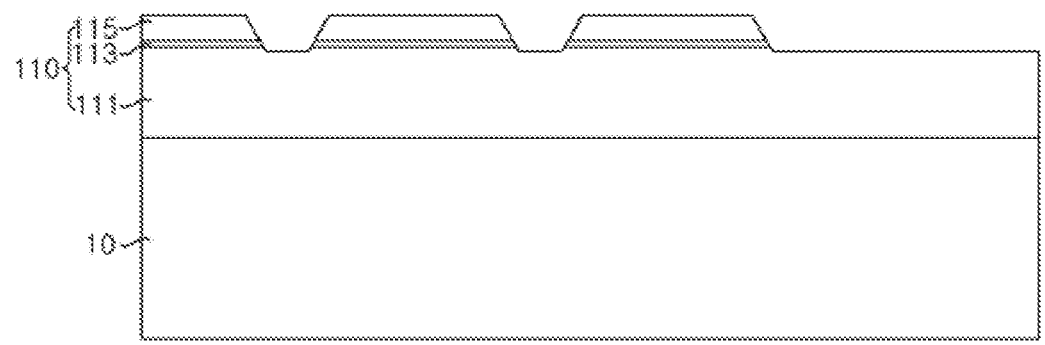

Referring to FIG. 3B, with the light emitting structure 110 formed on the growth substrate 10, a lower mesa structure is formed by partially etching an upper surface of the light emitting structure 110. In this process, the first conductive type semiconductor layer 111 may be partially exposed by etching.

Figure 3C:
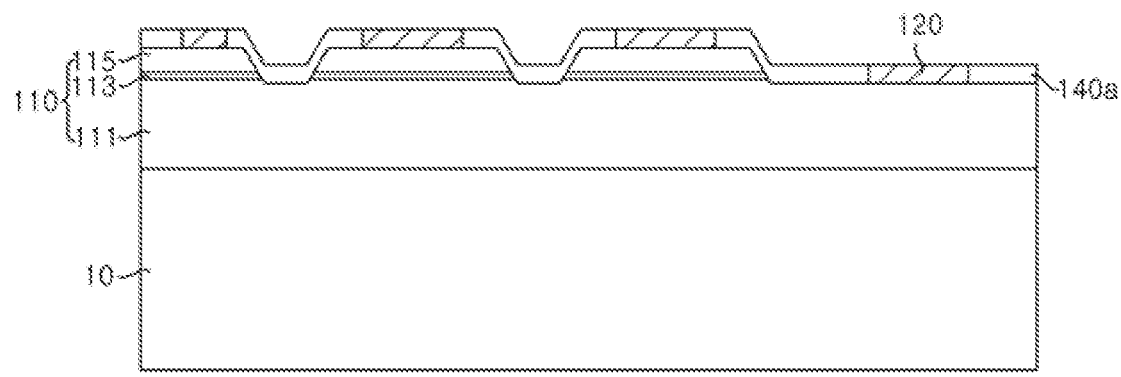

Referring to FIG. 3C, a reflective metal layer 120 is deposited on the upper surface of the light emitting structure 110, on which the lower mesa structure is formed. The reflective metal layer 120 is formed on a flat region of the light emitting structure 110, rather than being formed over the entire upper surface of the light emitting structure 110. Since the reflective metal layer 120 is formed on the second conductive type semiconductor layer 115 by deposition and the like, so as to be disposed only on a predetermined portion by a lift-off process, the reflective metal layer 120 is formed on the overall flat region, excluding an inclined surface. In this manner, although the reflective metal layer 120 may be formed in a smaller size than an exposed region of the second conductive type semiconductor layer 115, the reflective metal layer 120 may cover most of the second conductive type semiconductor layer 115. A second insulation layer 140a is further deposited on a region of the second conductive type semiconductor layer 115 on which the reflective metal layer 120 is not formed.

Figure 3D:
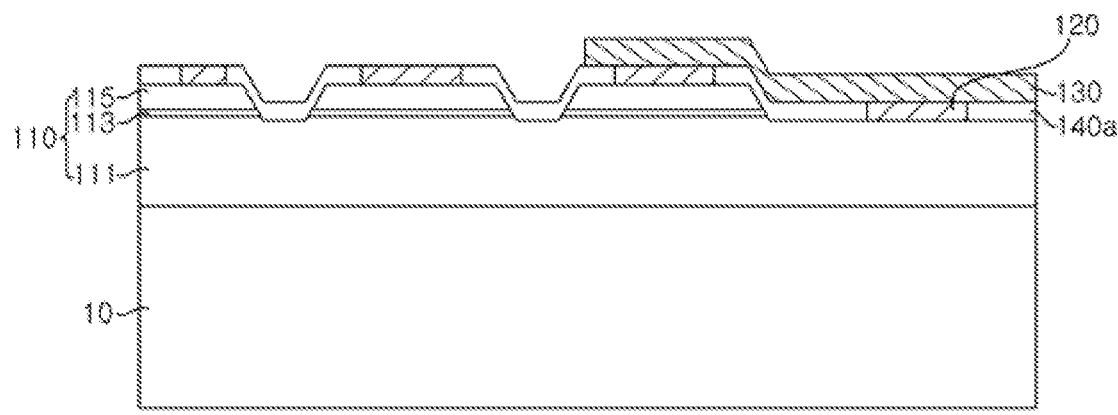

Referring to FIG. 3D, a cover metal layer 130 is deposited on the upper surface of the light emitting structure 110, on which the reflective metal layer 120 is formed. The cover metal layer 130 is formed to cover a portion of the reflective metal layer 120.

Figure 3E:
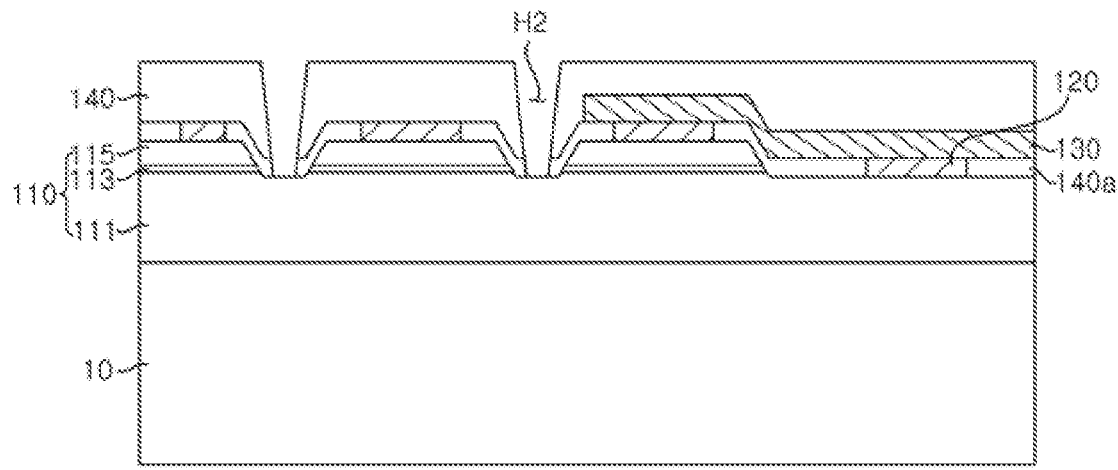

Referring to FIG. 3E, a first insulation layer 140 is formed to cover an upper surface of the cover metal layer 130 and the entire of the reflective metal layer 120, excluding a region of the reflective metal layer 120 on which the cover metal layer 130 is not formed. In addition, second holes H2 are formed at locations where the light emitting structure 110 is removed by etching. In this manner, portions of the first conductive type semiconductor layer 111 may be exposed by the second holes H2.

Figure 3F:
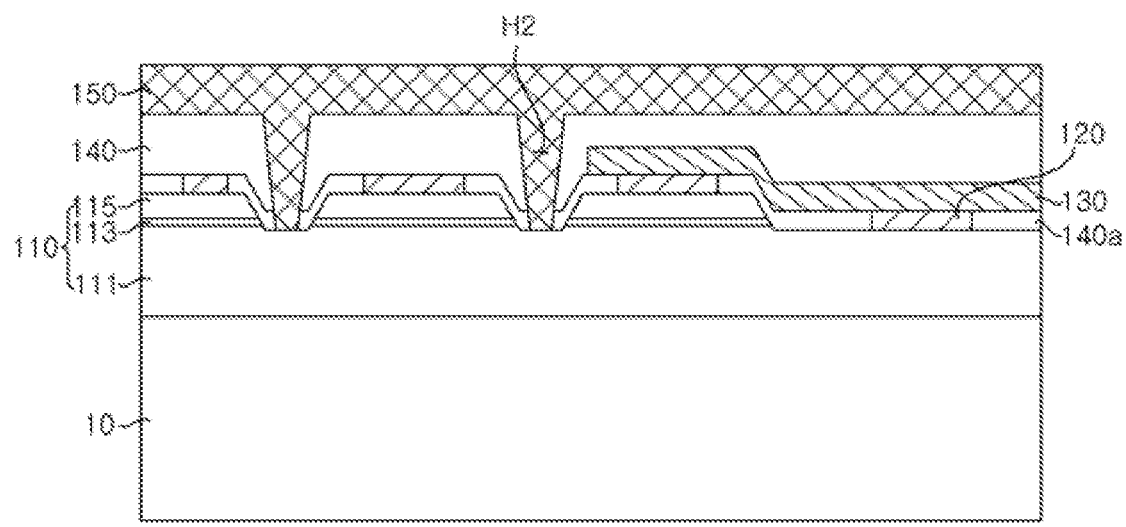

Referring to FIG. 3F, an electrode layer 150 is formed on the first insulation layer 140. The electrode layer 150 fills the second holes H2 formed in the first insulation layer 140, to contact the exposed regions of the first conductive type semiconductor layer 111 through the bottom portions of the second holes H2.

Figure 3G:
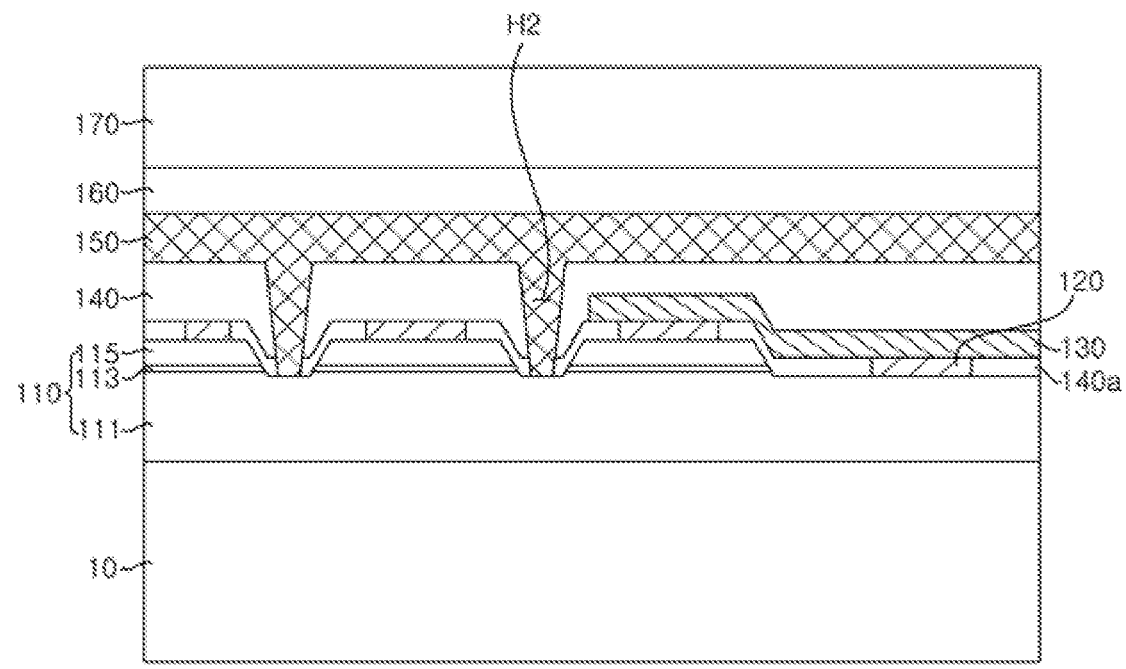

Referring to FIG. 3G, a bonding layer 160 may be formed on the electrode layer 150, and a substrate 170 may be formed on the bonding layer 160. The growth substrate 10 may be removed upon formation of the substrate 170. The bonding layer 160 may be formed to have ohmic contact with the electrode layer 150. The bonding layer 160 bonds the electrode layer 150 to the substrate 170, by adjusting pressure and temperature with the bonding layer 160 interposed between the electrode layer 150 and the substrate 170.

Figure 3H:
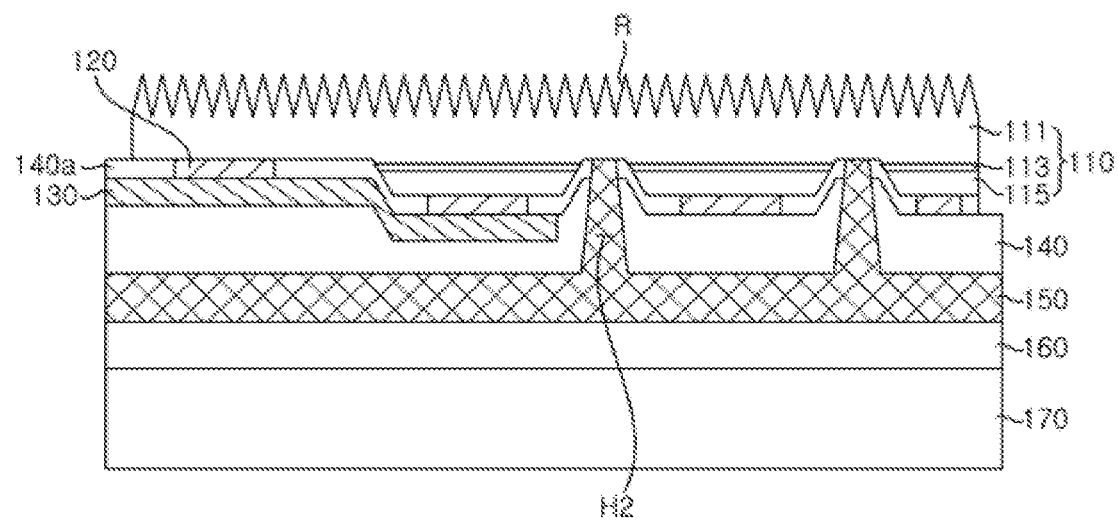
Figure 3I:
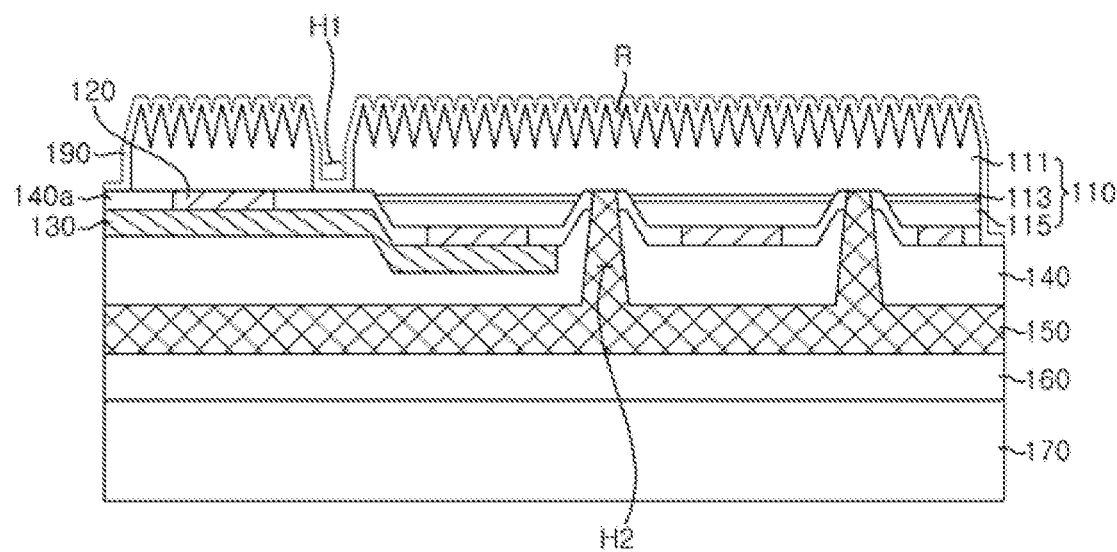
Figure 3J:
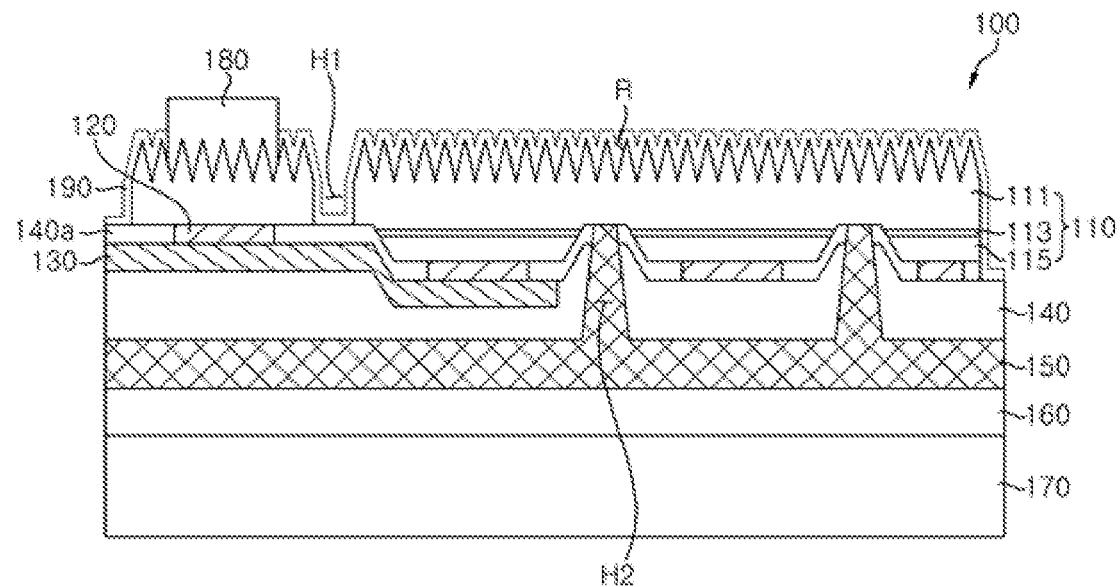

Referring to FIGS. 3H, 3I, and 3J, the light emitting diode 100 is turned upside down as compared to the configuration illustrated in FIGS. 3A to 3G. Thus, for convenience of description, upper and lower sides of the light emitting diode 100 will be described with reference to the structure shown in FIGS. 3H to 3J.

Referring to FIG. 3H, roughness "R" may be formed on the surface of the first conductive type semiconductor layer 111 in the course of removing the growth substrate 10. Upon removal of the growth substrate 10, a side surface of the light emitting structure 110 may also be partially removed.

Referring to FIG. 3I, with the growth substrate 10 removed from the light emitting structure 110, a first hole H1 is formed on a rear side of the light emitting structure 110, to which the substrate 170 is bonded, by penetrating through the light emitting structure 110. The first hole H1 is provided to divide the light emitting structure 110 from a pad installation section 111a. The first hole H1 may be formed by removing the first conductive type semiconductor layer 111, the active layer 113, and the second conductive type semiconductor layer 115, by dry etching or the like. In the pad installation section 111a, which is a divided portion from the light emitting structure 110, only the first conductive type semiconductor layer 111 may be included therein, as shown in FIG. 3I.

After forming the first hole H1, a protective layer 190 may be additionally formed on the first conductive type semiconductor layer 111. The protective layer 190 may be formed on overall region, which includes the upper and side surfaces of the first conductive type semiconductor layer 111 and the first hole H1. In this manner, the protective layer 190 may protect the light emitting structure 110 from an external environment, and the roughness "R" formed on the upper surface of the first conductive type semiconductor layer 111 may have gentle slope, which may improve light extraction efficiency.

Referring to FIG. 3J, with the light emitting structure 110 divided from the pad installation section 111a by the first hole H1, an electrode pad 180 is formed on an upper surface of the pad installation section 111a. The electrode pad 180 may be formed by deposition or any lift-off technology. The electrode pad 180 may contact the pad installation section 111a, on which a portion of the protective layer 190 is removed.

Figure 4:
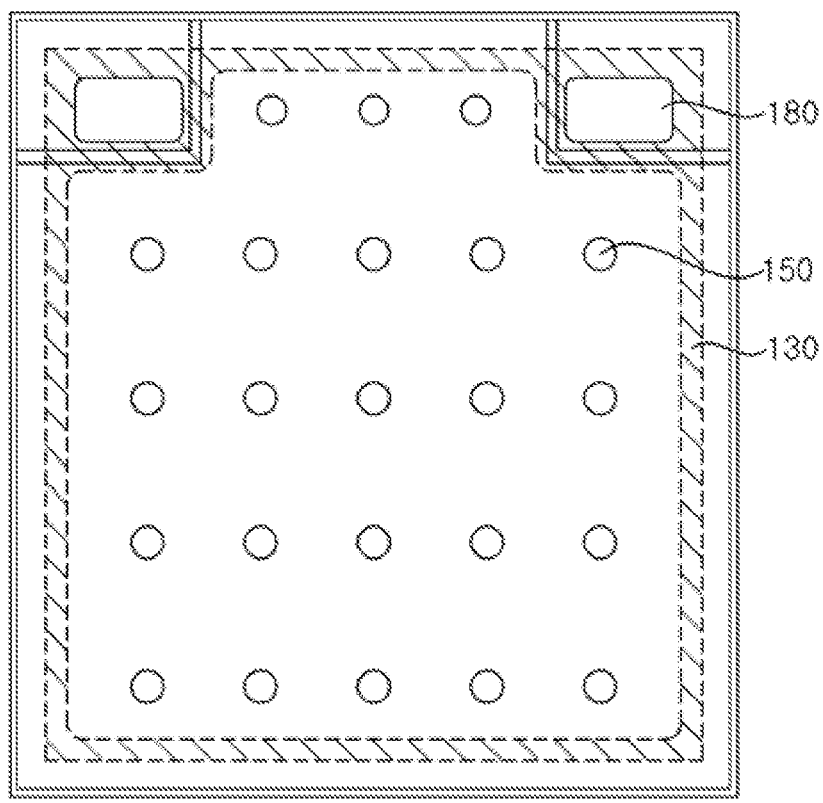
FIG. 4 is a plan view of a light emitting diode, according to an exemplary embodiment of the present invention.

FIG. 4 is a plan view of a light emitting diode, according to an exemplary embodiment of the present invention.

A light emitting diode 100 according to an exemplary embodiment of the present invention includes a light emitting structure 110, metal layers 120 and 130, a first insulation layer 140, an electrode layer 150, a bonding layer 160, a substrate 170, and electrode pads 180, and may further include a protective layer 190. Constituent elements and configuration of the light emitting diode 100 according to the present exemplary embodiment may be substantially similar to those of the light emitting diode illustrated with reference to FIGS. 1 to 3, and thus, repeated description of the substantially similar elements will be omitted.

Referring to FIG. 4, in the present exemplary embodiment, a cover metal layer 130 is formed along the periphery of the light emitting structure 110 and surround the electrode pads 180. Since the cover metal layer 130 covers the periphery of the reflective metal layer (not shown), the reflective metal layer is not exposed. Accordingly, damage to the reflective metal layer (not shown) may be prevented from infiltration of foreign substances to the reflective metal layer, which may occur when the reflective metal layer is exposed.

Figure 5A:
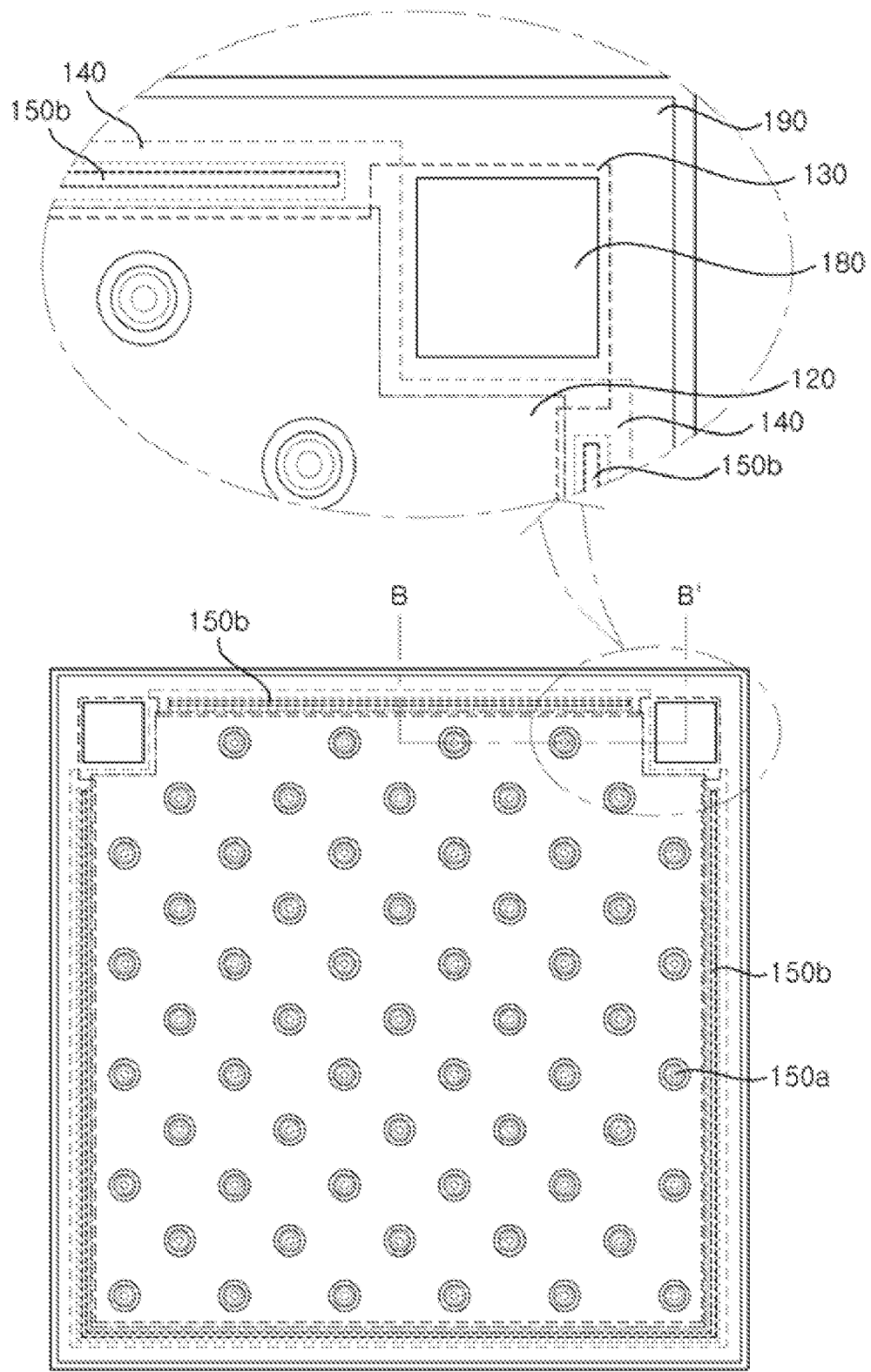
FIG. 5A is a plan view of a light emitting diode, according to an exemplary embodiment of the present invention.
Figure 5B:
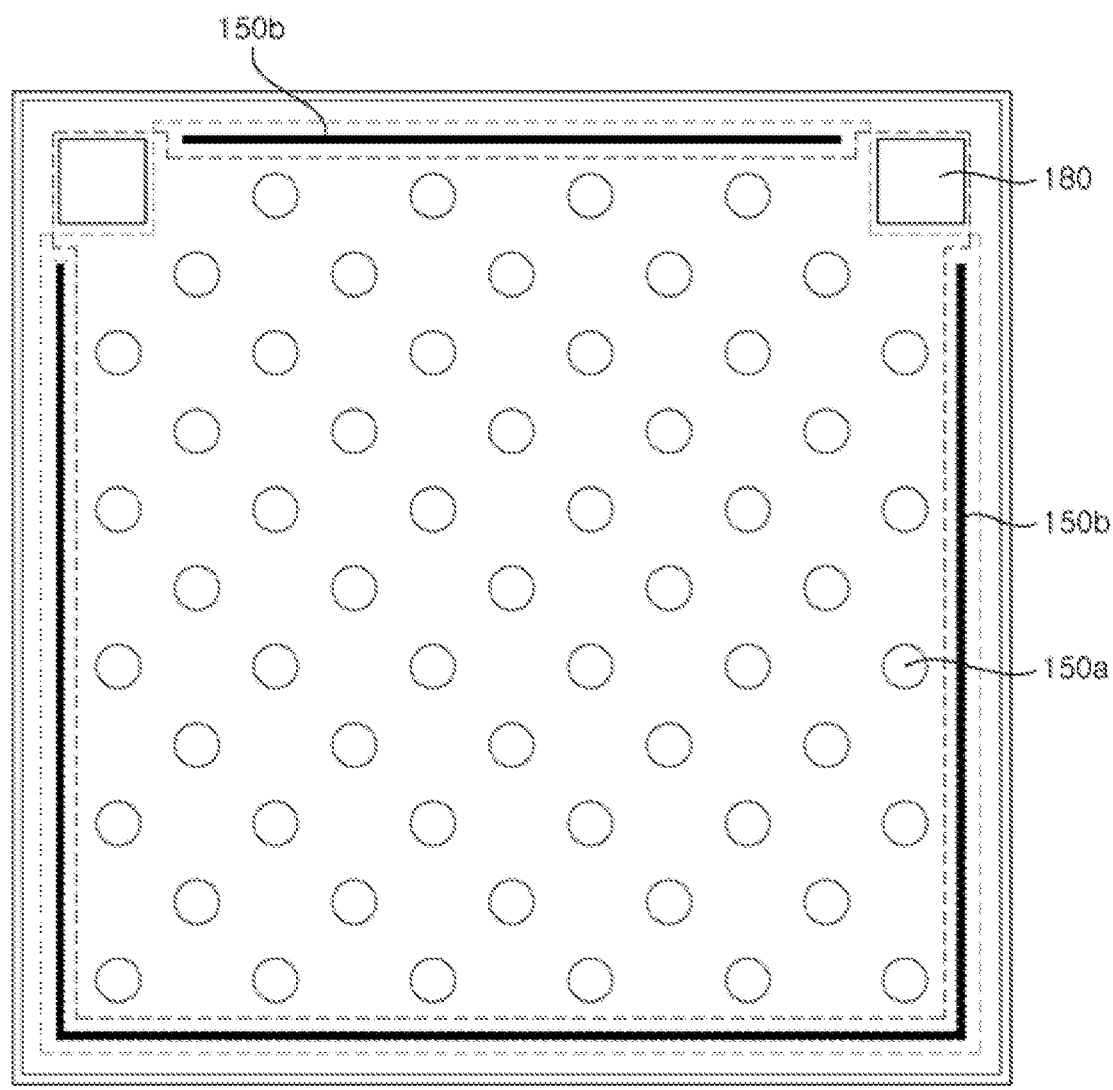
FIG. 5B is a plan view of the light emitting diode including a line electrode, according to an exemplary embodiment of the present invention.
Figure 6:
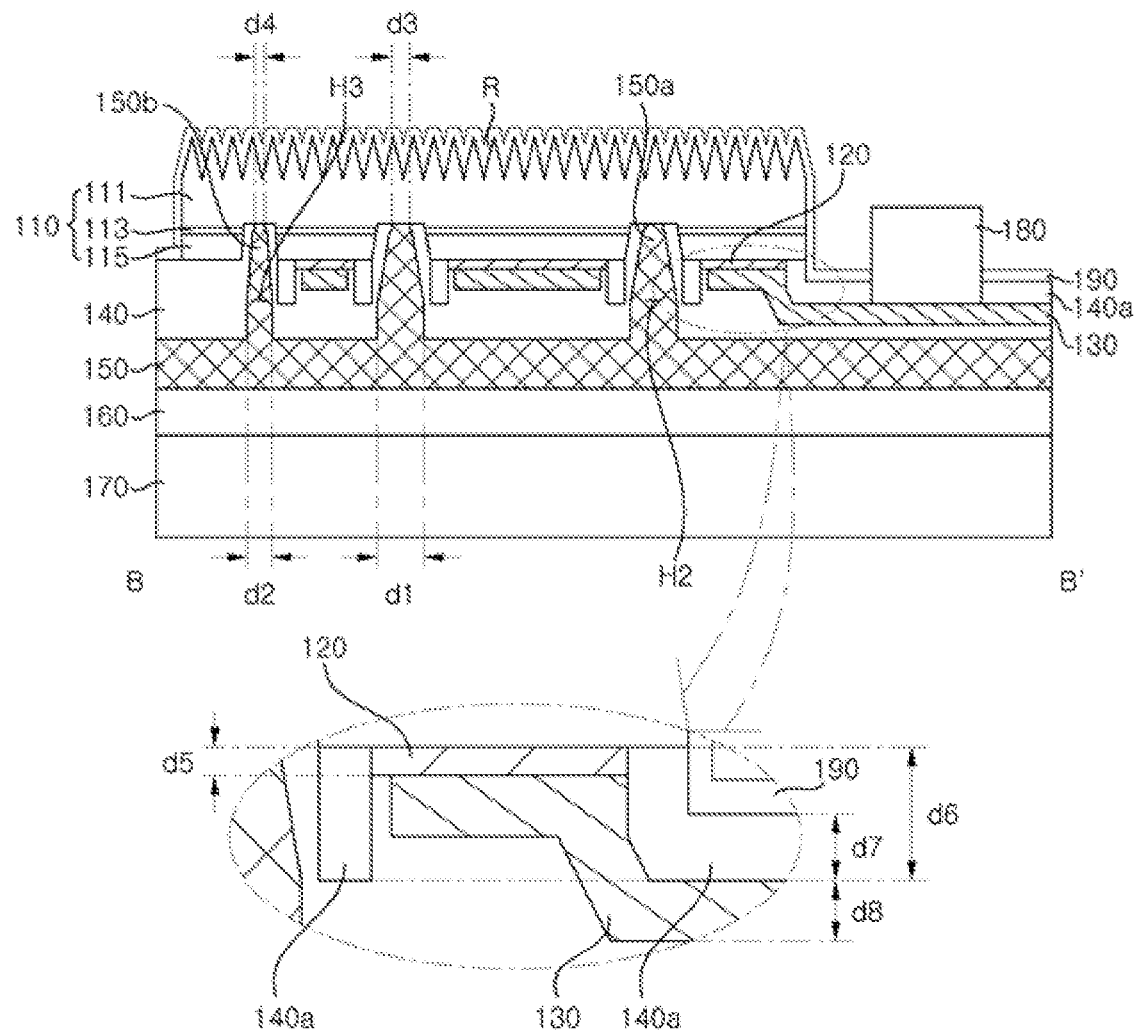
FIG. 6 is a sectional view taken along line B-B' of FIG. 5A.

FIG. 5A is a plan view of a light emitting diode according to an exemplary embodiment of the present invention, and FIG. 5B is a plan view of the light emitting diode including a line electrode, according to an exemplary embodiment of the present invention. FIG. 6 is a sectional view taken along line B-B' of FIG. 5A.

A light emitting diode 100 according to the present exemplary embodiment includes a light emitting structure 110, metal layers 120 and 130, a first insulation layer 140, a second insulation layer 140a, an electrode layer 150, a bonding layer 160, a substrate 170, electrode pads 180, and a protective layer 190. Constituent elements and configuration of the light emitting diode 100 are substantially similar to the light emitting diode illustrated with reference to FIGS. 1 to 3, and thus, repeated description of the substantially similar elements will be omitted.

Referring to FIGS. 5A and 5B, the light emitting diode 100 according to the present exemplary embodiment includes holes H2, which may be regularly or irregularly arranged. The light emitting diode 100 includes two electrode pads 180 respectively disposed at corners thereof. The reflective metal layer 120 and the cover metal layer 130 are formed to cover a substantial region of the light emitting diode 100 excluding some regions.

In the present exemplary embodiment, a line electrode 150b may be formed along the periphery of the light emitting diode 100. The line electrode 150b is formed to surround the entire periphery of the light emitting diode 100 excluding some region where the electrode pads 180 are formed. More particularly, in plan view of FIG. 5B, with two electrode pads 180 disposed at upper corners of the light emitting diode 100, the line electrode 150b may be formed along a periphery section of the light emitting diode 100 between the two electrode pads 180 and along other periphery sections of the light emitting diode 100.

Further, as shown in FIG. 5A, the cover metal layer 130 may be formed on a substantial region of the light emitting diode 100, excluding some region where the electrode pads 180 are formed. In areas where the electrode pads 180 are not formed, the cover metal layer 130 may be disposed inside the reflective metal layer 120. In particular, since the reflective metal layer 120 is formed to have a larger area than the cover metal layer 130 on the overall region of the light emitting diode 100, the reflective metal layer 120 may improve reflection efficiency of the light emitting diode 100, thereby improving luminous efficacy of the light emitting diode 100. In the present exemplary embodiment, the cover metal layer 130 may extend to a lower side of the electrode pad 180, in order to provide electrical connection between the electrode pad 180 and the second conductive type semiconductor layer 115.

The line electrode 150b may be formed on a further outer region of the light emitting diode 100 than the reflective metal layer 120 and the cover metal layer 130. In this manner, the side surface of the light emitting diode 100 may be protected, as the first insulation layer 140 is formed outside the line electrode 150b.

The light emitting diode 100 according to the present exemplary embodiment will be described in more detail with reference to FIG. 6. Referring to FIG. 6, the bonding layer 160 is formed on the substrate 170 and the electrode layer 150 is bonded to the substrate 170 via the bonding layer 160. The first insulation layer 140 is formed on the electrode layer 150. The metal layers 120 and 130 including the cover metal layer 130 and the reflective metal layer 120 are sequentially stacked on the first insulation layer 140. The second insulation layer 140a is formed on a side surface of the reflective metal layer 120. The second insulation layer 140a may be formed to a larger thickness than the total thickness of the reflective metal layer 120 and the cover metal layer 130, as will be described in more detail below.

The light emitting structure 110 is disposed on the second insulation layer 140a and the reflective metal layer 120. The light emitting structure 110 includes mesas, and second holes H2 and a third hole H3 are formed between the mesas. The second holes H2 and the third hole H3 are formed through the first insulation layer 140 to expose the first conductive type semiconductor layer 111 therethrough. Further, the electrode layer 150 fills the second holes H2 and the third hole H3, for electrical connection between the electrode layer 150 and the first conductive type semiconductor layer 111. Side surfaces of the second holes H2 and the third hole H3 are covered by the first insulation layer 140, such that the electrode layer 150 filling the second holes H2 and the third hole H3 is electrically insulated from other layers.

The second holes H2 have a circular shape and the third hole H3 has a line shape extending in one direction in plan view. Accordingly, the electrode layer 150 filling the second holes H2 has a different structure than the electrode layer 150 filling the third hole H3. As used herein, the electrode layer 150 filling the second holes H2 are referred to as the first electrodes 150a, and the electrode layer 150 filling the third hole H3 is referred to as the line electrode 150b. The first electrodes 150a may be distributed over the overall surface of the light emitting diode 100 and have a regular or irregular arrangement.

In the present exemplary embodiment, the line electrode 150b may have a line shape having directionality along the periphery of the light emitting diode 100, excluding the corners of the light emitting diode 100, on which the electrode pads 180 are disposed. The line electrode 150b may alternatively have a curved shape, rather than the line shape extending in one direction, and may be formed in regions where the electrode pads 180 are disposed.

As described above, when the line electrode 150b is formed along the periphery of the light emitting diode 100, deterioration of luminous efficacy at the periphery of the light emitting diode 100, due to current crowding at the center of the light emitting diode 100 in plan view, may be prevented. In particular, the line electrode 150b formed along the periphery of the light emitting diode 100 may improve luminous efficacy at the periphery of the light emitting diode 100. As such, the light emitting diode 100 may have uniform light emission, thereby improving luminous efficacy.

According to an exemplary embodiment of the present invention, the line electrode 150b may be continuously formed at corners of the light emitting diode 100, at which the electrode pads 180 are not formed, in a shape corresponding to the corners of the light emitting diode 100, thereby improving luminous efficacy at a distal end of the light emitting diode 100.

The metal layers 120 and 130 may not be formed outside the line electrode 150b. In FIG. 2, the outside of the line electrode 150b is a left side of the line electrode 150b and only the first insulation layer 140 is formed outside the line electrode 150b.

Referring to FIG. 6, a width d1 of the first electrodes 150a filling the second hole H2 is different from a width d2 of the line electrode 150b filling the third hole H3. More particularly, the width d2 of the line electrode 150b is smaller than the width d1 of the first electrodes 150a. The line electrode 150b is formed along the periphery of the light emitting diode 100 and is disposed to be separate from arrangement of the first electrodes 150a. Thus, when the width d2 of the line electrode 150b is smaller than the width d1 of the first electrodes 150a, current spreading in the line electrode 150b may be carried out more gently than current spreading in the first electrodes 150a.

Further, a contact width d3 between the first electrodes 150a and the first conductive type semiconductor layer 111 is different from a contact width d4 between the line electrode 150b and the first conductive type semiconductor layer 111. More particularly, the contact width d4 between the line electrode 150b and the first conductive type semiconductor layer 111 is smaller than the contact width d3 between the first electrodes 150a and the first conductive type semiconductor layer 111.

The first insulation layer 140 is formed on the overall region of the electrode layer 150, excluding some regions where the second holes H2 and the third hole H3 are formed. The second insulation layer 140a is formed at opposite sides of the reflective metal layer 120. In the present exemplary embodiment, a thickness d6 of the second insulation layer 140a is larger than a thickness d5 of the reflective metal layer 120, and is larger than a sum of thicknesses d5 and d8, where d5 is a thickness of the reflective metal layer 120 and d8 is a thickness d8 of the cover metal layer 130 covering the reflective metal layer 120. For example, the reflective metal layer 120 has a thickness d5 of about 2,200 Å and the cover metal layer 130 has a thickness d8 of about 7,000 Å. The second insulation layer 140a formed at the opposite sides of the reflective metal layer 120 has a thickness d6 of about 16,000 Å.

According to the present exemplary embodiment, the electrode pads 180 are disposed at the corners of the light emitting diode 100. Further, the electrode pads 180 are formed after removal of the light emitting structure 110 by etching portions of the light emitting structure 110, on which the electrode pad 180 is to be disposed. In a vertical structure of the light emitting structure, at which the electrode pads 180 are disposed, the first insulation layer 140 is formed on the electrode layer 150 and the cover metal layer 130 is formed on the first insulation layer 140. Further, the second insulation layer 140a is formed on the cover metal layer 130.

The cover metal layer 130 extends from the lower side of the light emitting structure 110 and has a uniform thickness d8. In addition, the second insulation layer 140a formed on the cover metal layer 130 extends from the second insulation layer 140a formed under the light emitting structure 110, and has a smaller thickness d7 than the thickness d6 thereof under the light emitting structure 110. In this manner, the second insulation layer 140a formed under the light emitting structure 110 has a thickness d6 of about 16,000 Å and the second insulation layer 140a formed under the electrode pad 180 has a thickness d7 of about 8,000 Å.

When the thickness d6 of the second insulation layer 140a disposed under the light emitting structure 110 is larger than the thickness d7 of the second insulation layer disposed under the electrode pad 180, sufficient electrical insulation between the second conductive semiconductor layer and the electrode layer 150 may be secured. Since high electric current and high voltage may be applied to the light emitting diode 100, electrical insulation between the light emitting structure 110 and the electrode layer 150 may be an important factor.

Further, since the light emitting structure 110 is not formed in some region where the electrode pads 180 are formed, a high thickness of the second insulation layer 140a may not be utilized, unlike the second insulation layer under the light emitting structure 110. Although increase in thickness of the second insulation layer 140a may improve an insulating function, luminous efficacy of the light emitting diode 100 may be deteriorated, due to a relative decrease in thickness of the light emitting structure 110 in a luminous region.

Further, a reflection area is enlarged by the cover metal layer 130 extending from the lower side of the light emitting structure 110 to a location at which the electrode pad 180 is formed, thereby improving luminous efficacy of the light emitting diode 100.

Since the electrode pad 180 is formed in a region from which the light emitting structure 110 is removed, the second insulation layer 140a is partially removed to allow the electrode pad 180 to be formed, while contacting the cover metal layer 130, as shown in FIG. 2. Further, the protective layer 190 is formed to cover the light emitting structure 110, and may be formed on the overall region of the light emitting diode 100 excluding the electrode pad 180.

Figure 7:
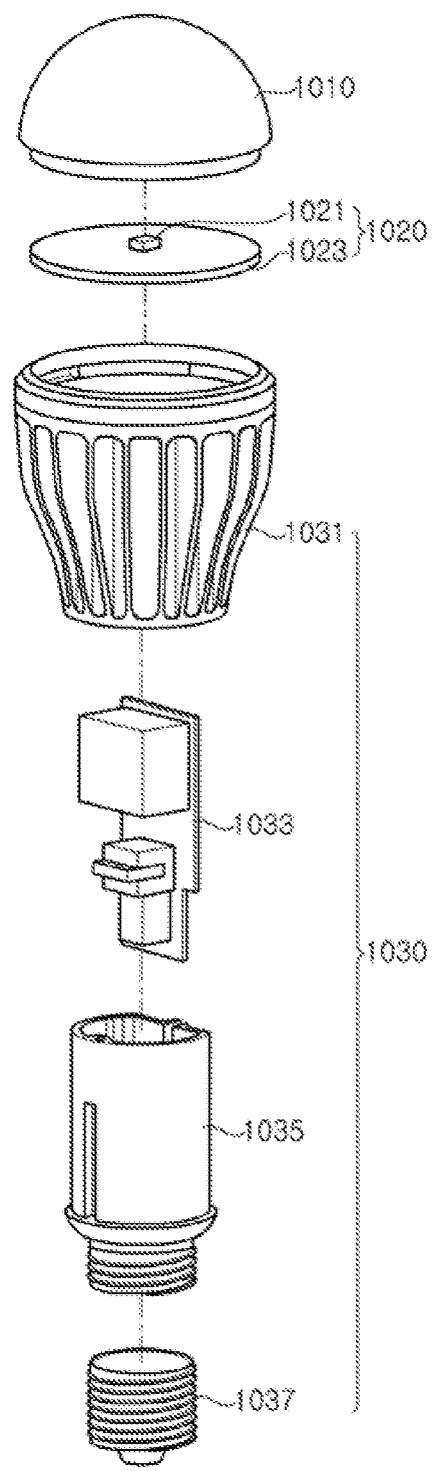
FIG. 7 is an exploded perspective view of an exemplary lighting apparatus to which a light emitting device according to an exemplary embodiment of the present invention is applied.

FIG. 7 is an exploded perspective view of an exemplary lighting apparatus to which a light emitting device according to an exemplary embodiment of the present invention is applied.

Referring to FIG. 7, the lighting apparatus according to the present exemplary embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape so long as the body may supply electric power to the light emitting diode module 1020 while receiving and supporting the light emitting diode module 1020. For example, as shown in the drawing, the body 1030 may include a body case 1031, a power supply 1033, a power supply case 1035, and a power source connection section 1037.

The power supply 1033 is received in the power supply case 1035 to be electrically connected to the light emitting diode module 1020, and may include at least one IC chip. The IC chip may regulate, change, or control electric power supplied to the light emitting diode module 1020. The power supply case 1035 may receive and support the power supply 1033. The power supply case 1035 having the power supply 1033 secured therein may be disposed within the body case 1031. The power source connection section 1037 is disposed at a lower end of the power supply case 1035 and coupled thereto. Accordingly, the power source connection section 1037 is electrically connected to the power supply 1033 within the power supply case 1035, and may serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes and the light emitting devices according to the exemplary embodiments described above.

The diffusive cover 1010 is disposed on the light emitting diode 1021 and may be secured to the body case 1031 to cover the light emitting diode 1021. The diffusive cover 1010 may be formed of or include a light-transmitting material, and light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 8A:
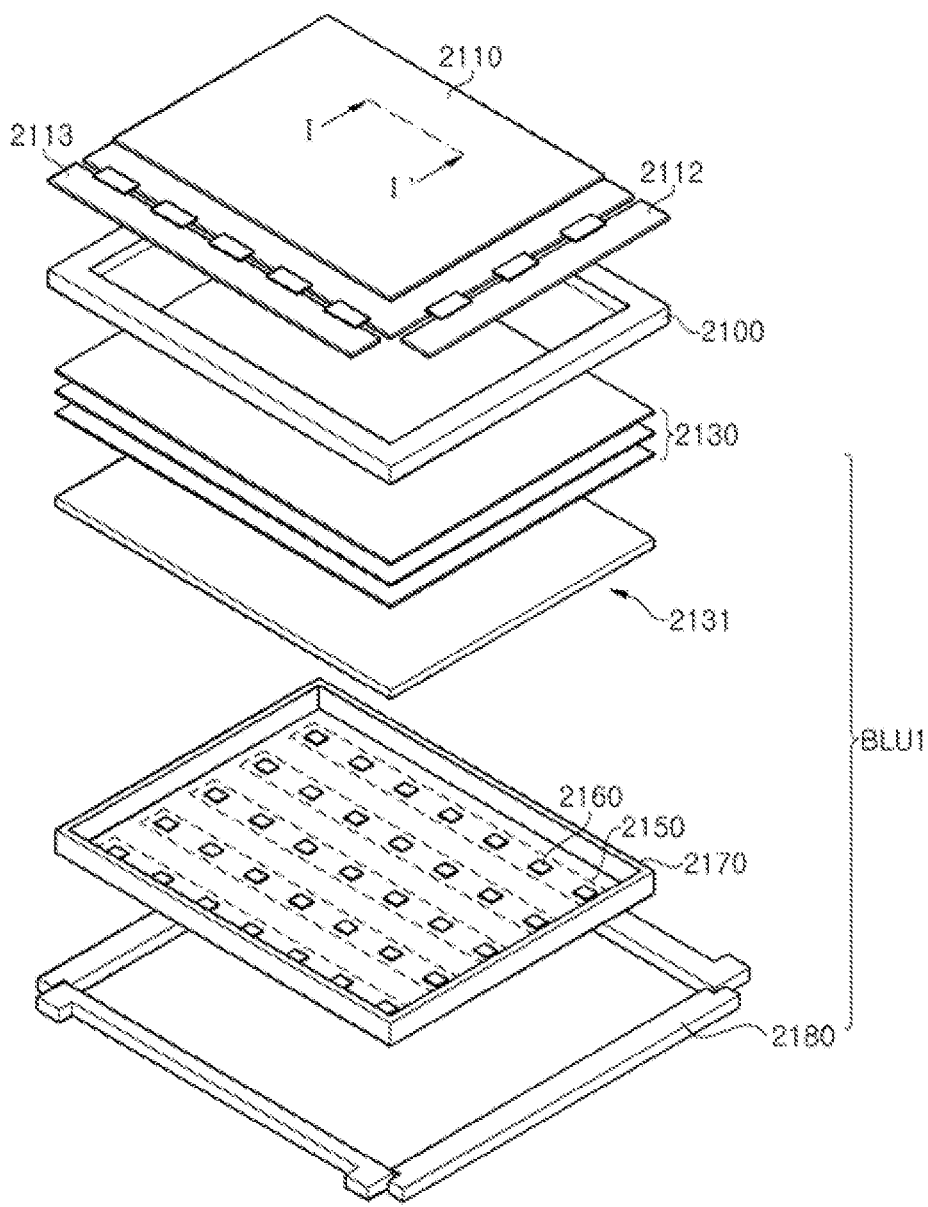
FIGS. 8A and 8B are sectional views of an exemplary display device to which a light emitting device according to an exemplary embodiment of the present invention is applied.
Figure 8B:
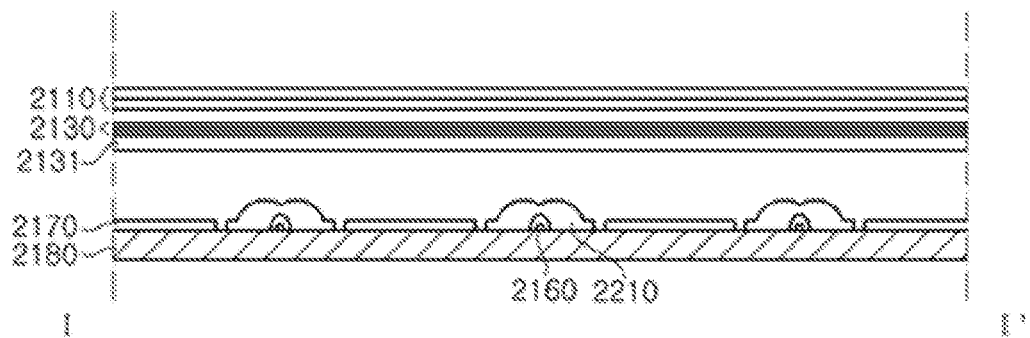

FIGS. 8A and 8B are sectional views of an exemplary display device to which a light emitting device according to an exemplary embodiment of the present invention is applied.

The display device according to the present exemplary embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the edge of the display panel 2110 to supply driving signals to a gate line. The gate driving PCBs 2112 and 2113 may be formed on a thin film transistor substrate, rather than being formed on separate PCBs.

The backlight unit includes a light source module, which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. However, it should be understood that other implementations are also possible. When a reflective material is coated onto a surface thereof, the substrate may be disposed on the reflective sheet 2170. Further, according to the present exemplary embodiment, a plurality of substrates may be arranged parallel to one other. However, it should be understood that other implementations are also possible and the light source module may include a single substrate.

The light emitting diodes 2160 may include at least one of the light emitting diodes and the light emitting devices according to the exemplary embodiments described above. The light emitting diodes 2160 may be regularly arranged in a predetermined pattern on the substrate. In addition, a lens 2210 is disposed on each of the light emitting diodes 2160 to improve uniformity of light emitted from the plurality of light emitting diodes 2160.

The diffusive plate 2131 and the optical sheets 2130 are disposed on the light emitting devices 2160. Light emitted from the light emitting devices 2160 may be supplied in the form of sheet light to the display panel 2110 through the diffusive plate 2131 and the optical sheets 2130.

In this way, the light emitting diodes according to the exemplary embodiments of the present invention may be applied to direct type displays like the display according to the present exemplary embodiment.

Figure 9A:
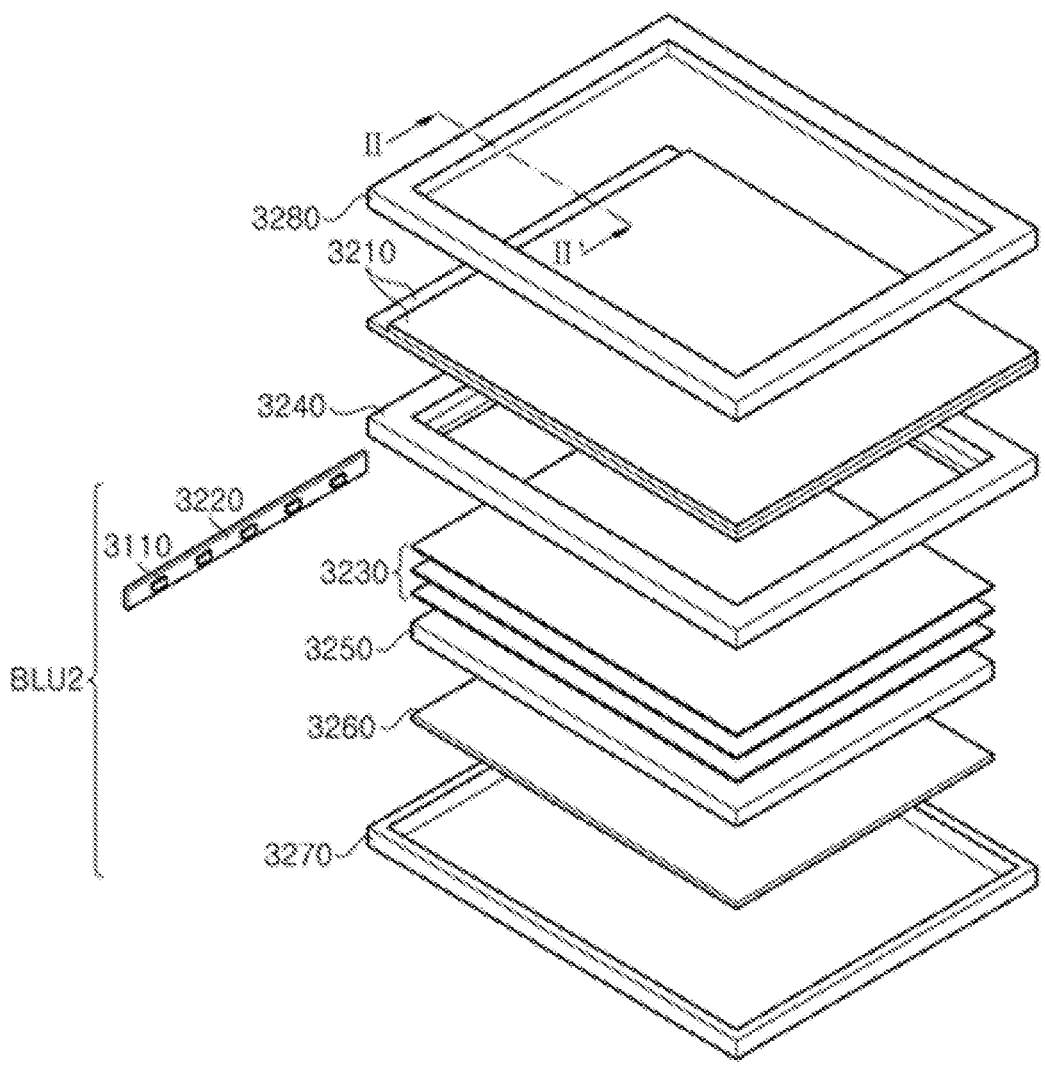
FIGS. 9A and 9B are sectional views of an exemplary display device to which a light emitting device according to an exemplary embodiment of the present invention is applied.
Figure 9B:
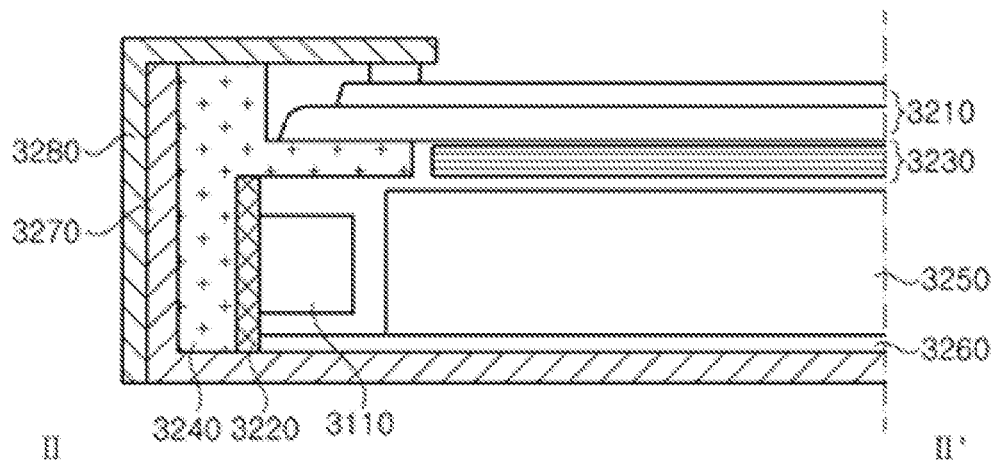

FIGS. 9A and 9B are sectional views of an exemplary display device to which a light emitting device according to an exemplary embodiment of the present invention is applied.

The display device according to the present exemplary embodiment includes a display panel 3210 on which an image is displayed, and a backlight unit disposed at a rear side of the display panel 3210 and emitting light thereto. Further, the display device includes a frame 3240 supporting the display panel 3210 and receiving the backlight unit, and covers 3240 and 3280 surrounding the display panel 3210.

The display panel 3210 is not particularly limited and may be or include, for example, a liquid crystal panel including a liquid crystal layer. A gate driving PCB may be further disposed at an edge of the display panel 3210 to supply driving signals to a gate line. Here, the gate driving PCB may be formed on a thin film transistor substrate, rather than being formed on a separate PCB. The display panel 3210 is secured by the covers 3240 and 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to the present exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board.

The light emitting diodes 3110 may include at least one of the light emitting diodes and the light emitting devices according to the exemplary embodiments of the present invention described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display according to the present exemplary embodiment.

Figure 10:
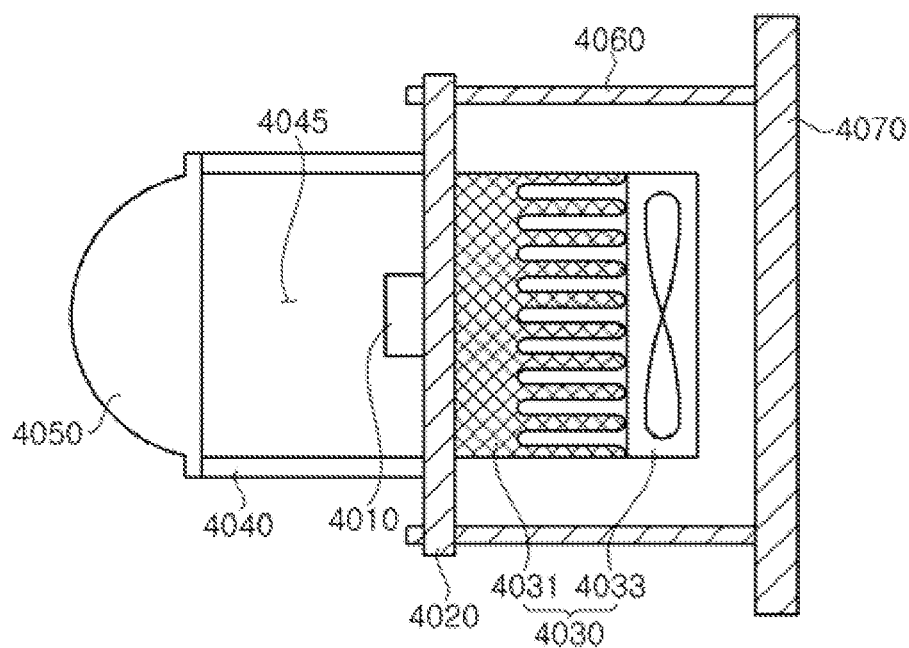
FIG. 10 10 is a sectional view of an exemplary headlight to which a light emitting device according to an exemplary embodiment of the present invention is applied.

FIG. 10 is a sectional view of an exemplary headlight to which a light emitting device according to an exemplary embodiment of the present invention is applied.

Referring to FIG. 10, the headlight includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and disposed above the lamp body 4070. As the substrate 4020, any member capable of supporting the light emitting diode 4010 may be used without limitation. For example, the substrate 4020 may be or include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes and the light emitting devices according to the exemplary embodiments of the present invention described above.

The cover lens 4050 is disposed on a path of light emitted from the light emitting diode 4010. For example, as shown in the drawing, the cover lens 4050 may be spaced apart from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus may act as a light guide that provides a luminous path 4045. The connection member 4040 may be formed of or include a light reflective material or coated therewith. On the other hand, the heat dissipation unit 4030 may include heat dissipation fins 4031 and/or a heat dissipation fan 4033, and dissipates heat generated upon operation of the light emitting diode 4010.

In this way, the light emitting diodes according to the exemplary embodiments of the present invention may be applied to headlights, particularly, headlights for vehicles, like the display device according to the present exemplary embodiment.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A light emitting diode, comprising:
a rectangular light emitting structure comprising:
a second conductive type semiconductor layer;
a first conductive type semiconductor layer disposed on the second conductive type semiconductor layer;
an active layer disposed between the first and second conductive type semiconductor layers;
a plurality of first holes and a second hole formed through the active layer and the second conductive type semiconductor layer to expose the first conductive type semiconductor layer;
a metal layer disposed on the light emitting structure, electrically connected to the second conductive type semiconductor layer, and covering a portion of the light emitting structure;
a first insulation layer disposed on the metal layer and covering the metal layer;
an electrode layer disposed on the first insulation layer, the electrode layer covering the first insulation layer and filling the plurality of first holes and the second hole to electrically connect to the fist conductive type semiconductor layer;
a first electrode pad located at a first corner of the light emitting structure and electrically connected to the metal layer on a side opposite the first insulation layer; and
a second electrode pad located at a second corner of the light emitting structure adjacent the first corner of the light emitting structure and electrically connected to the metal layer on the side opposite the first insulation layer,
wherein the electrode layer filling the second hole is a line electrode, the line electrode being disposed along a periphery of the light emitting structure excluding the first and second corners where the first and second electrode pads are located, wherein the line electrode extends across substantially the entire width of the second hole;
wherein a first portion of the second hole has a line shape along a first side of a periphery of the light emitting structure between the first and second electrode pads, and
a second portion of the second hole has a line shape along a second side, a third side, and a fourth side of the periphery of the light emitting structure to have the line electrode continuously formed at a third corner of the fourth corner of the light emitting structure.

2. The light emitting diode according to claim 1, wherein:
the electrode layer filling the plurality of first holes is a first electrode; and
the line electrode has a smaller width than the first electrode.

3. The light emitting diode according to claim 1, wherein the metal layer is disposed inside the line electrode in plan view.

4. The light emitting diode according to claim 1, wherein the line electrode is disposed on the light emitting structure in a region in which the first electrode pad is not formed.

5. The light emitting diode according to claim 1, wherein the first portion of the second hole is separated from the second portion of the second hole.

6. The light emitting diode according to claim 1, the metal layer does not cover the first electrode pad, the second electrode pad, and the second hole.

7. A light emitting diode, comprising:
a light emitting structure comprising:
a second conductive type semiconductor layer;
a first conductive type semiconductor layer including a first section disposed in a corner of the light emitting structure, and a second section separate from the first section and disposed on the second conductive type semiconductor layer; and
an active layer disposed between the first and second conductive type semiconductor layers;
a second hole formed through the active layer and the second conductive type semiconductor layer, and exposing the first conductive type semiconductor layer;
a reflective metal layer disposed on the light emitting structure and contacting a portion of the light emitting structure;
a cover metal layer disposed on the reflective metal layer and contacting at least a portion of the reflective metal layer;
a first insulation layer disposed on the cover metal layer and covering the reflective metal layer and the cover metal layer;
an electrode layer disposed on the first insulation layer, the electrode layer covering the first insulation layer and filling the second hole;
an electrode pad disposed on the first section of the first conductive type semiconductor layer; and
a first opening formed through the first conductive type semiconductor layer and corresponding to the cover metal layer,
wherein the first opening isolates the first section of the first conductive type semiconductor layer from the second section of the first conductive type semiconductor layer, and the electrode pad overlaps the cover metal layer.

8. The light emitting diode according to claim 7, further comprising:
a pad installation section spaced apart from the light emitting structure by the first opening,
wherein the cover metal layer is disposed on a portion of the light emitting structure and a portion of the pad installation section.

9. The light emitting diode according to claim 8, wherein the cover metal layer is disposed along peripheries of the light emitting structure and the pad installation section.

10. The light emitting diode according to claim 9, wherein the cover metal layer covers a periphery of the reflective metal layer.

11. The light emitting diode according to claim 7, wherein the electrode layer fills the second hole and ohmic contacts with the first conductive type semiconductor layer.

12. The light emitting diode according to claim 7, wherein a region of the first insulation layer in which the second hole is not formed is disposed on the reflective metal layer.

13. The light emitting diode according to claim 7, wherein the first section and the second section of the first conductive type semiconductor layer further comprises n-type electrode material.

14. The light emitting diode according to claim 7, wherein the first opening comprises a linear opening that physically divides the first conductive type semiconductor layer into the first section and the second section, and electrically isolates the first electrode pad from the second section.

* * * * *